United States Patent
Tsunetsugu

(10) Patent No.: US 9,768,765 B2
(45) Date of Patent: Sep. 19, 2017

(54) GATE CONTROL CIRCUIT AND POWER SUPPLY CIRCUIT

(71) Applicant: KABUSHIKI KAISHA TOSHIBA, Tokyo (JP)

(72) Inventor: Yukio Tsunetsugu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/250,569

(22) Filed: Aug. 29, 2016

(65) Prior Publication Data
US 2017/0222637 A1 Aug. 3, 2017

(30) Foreign Application Priority Data
Feb. 3, 2016 (JP) .................................. 2016-019178

(51) Int. Cl.
| | | |
|---|---|---|
| H03K 3/00 | (2006.01) |
| H03K 17/082 | (2006.01) |
| H03K 17/284 | (2006.01) |
| H03K 17/30 | (2006.01) |
| H03K 17/567 | (2006.01) |
| H03K 5/08 | (2006.01) |
| H03K 3/037 | (2006.01) |

(52) U.S. Cl.
CPC ....... *H03K 17/0822* (2013.01); *H03K 3/0377* (2013.01); *H03K 5/08* (2013.01); *H03K 17/284* (2013.01); *H03K 17/302* (2013.01); *H03K 17/567* (2013.01)

(58) Field of Classification Search
USPC ................ 327/205, 403, 404, 407, 409, 410
See application file for complete search history.

(56) References Cited

U.S. PATENT DOCUMENTS

| | | | | |
|---|---|---|---|---|
| 6,057,728 A * | 5/2000 | Igarashi | ............. | H03K 17/0828 327/427 |
| 6,580,627 B2 * | 6/2003 | Toshio | .................... | H02M 1/32 363/132 |
| 8,488,283 B2 | 7/2013 | Ando et al. | | |
| 8,913,363 B2 | 12/2014 | Takata et al. | | |
| 9,628,072 B2 * | 4/2017 | Toshiyuki | ............ | H03K 17/567 |
| 2015/0069988 A1 | 3/2015 | Miura et al. | | |

FOREIGN PATENT DOCUMENTS

| | | |
|---|---|---|
| JP | 2007-228436 A | 9/2007 |
| JP | 2012-010577 A | 1/2012 |

* cited by examiner

*Primary Examiner* — An Luu
(74) *Attorney, Agent, or Firm* — Patterson & Sheridan, LLP

(57) ABSTRACT

A gate control circuit includes a first pulse generator that outputs a first pulse signal when an input signal changes from a first logical level to a second logical level, a first gate controlling portion that controls a gate voltage of a first transistor based on a first control signal when the input signal is at the second logical level, a second pulse generator that outputs a second pulse signal when the input signal changes from the second logical level to the first logical level, and a second gate controlling portion that controls the gate voltage of the first transistor based on a second control signal when the input signal is at the first logical level. The first gate controlling portion includes a first overcurrent controlling portion that controls a voltage level of the first control signal after an expiration of an output period of the first pulse signal.

20 Claims, 10 Drawing Sheets

GATE CONTROL CIRCUIT AND POWER SUPPLY CIRCUIT

CROSS-REFERENCE TO RELATED APPLICATION

This application is based upon and claims the benefit of priority from Japanese Patent Application No. 2016-019178, filed Feb. 3, 2016, the entire contents of which are incorporated herein by reference.

FIELD

Embodiments described herein relate generally to gate control circuits and power supply circuits.

BACKGROUND

To the gate of a power semiconductor element, such as an IGBT (insulated-gate bipolar transistor), which switches a high current, a high voltage of 10 V or higher has to be applied. Thus, the gate of the power semiconductor element is often driven by a high-voltage high-side MOS transistor and a low-side MOS transistor.

The source of the high-side MOS transistor is connected to the gate of the power semiconductor element via a resistor, and the drain of the low-side MOS transistor is also connected to the gate of the power semiconductor element via a resistor.

However, if some defects cause the drain of the high-side MOS transistor to short out at a ground level (ground fault) or the drain of the low-side MOS transistor to short out at a power supply level (supply fault), a large current flows between the source and the drain of the short-circuited high-side MOS transistor or low-side MOS transistor and a breakdown occurs.

DETAILED DESCRIPTION

According to an embodiment, a gate control circuit and a power supply circuit prevent a large current from flowing between the source and the drain of a transistor even when the drain or source of the transistor shorts out at a power supply level or a ground level.

In general, according to one embodiment, a gate control circuit includes: a first pulse generator that outputs a first pulse signal having a pulse width of a first time interval when an input signal changes from a first logical level to a second logical level; a first gate controlling portion that controls a gate voltage of a first transistor based on a first control signal when the input signal is at the second logical level; a second pulse generator that outputs a second pulse signal having a pulse width of a second time interval when the input signal changes from the second logical level to the first logical level; and a second gate controlling portion that controls the gate voltage of the first transistor based on a second control signal when the input signal is at the first logical level. The first gate controlling portion includes a second transistor that controls the gate voltage of the first transistor based on the first control signal when the input signal is at the second logical level and a first overcurrent controlling portion that controls a voltage level of the first control signal such that a current between a source and a drain of the second transistor does not exceed a first threshold value after an expiration of an output period of the first pulse signal, and the second gate controlling portion includes a third transistor that controls the gate voltage of the first transistor based on the second control signal when the input signal is at the second logical level and a second overcurrent controlling portion that controls a voltage level of the second control signal such that a current between a source and a drain of the third transistor does not exceed a second threshold value after an expiration of an output period of the second pulse signal.

First Embodiment

Figure 1:
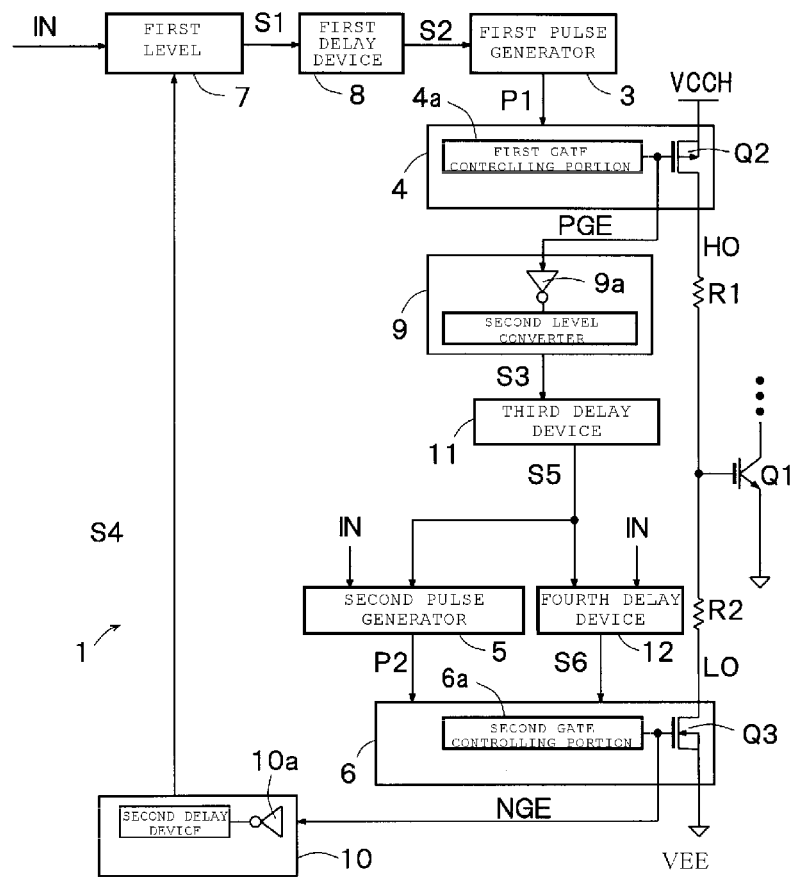
FIG. 1 is a block diagram depicting the schematic configuration of a power supply circuit provided with a gate control circuit according to a first embodiment.

Hereinafter, embodiments will be described with reference to the drawings. FIG. 1 is a block diagram depicting the schematic configuration of a power supply circuit 2 provided with a gate control circuit 1 according to a first embodiment. The gate control circuit 1 in the power supply circuit 2 in FIG. 1 controls the gate voltage of a transistor (a first transistor) Q1 configured as a power semiconductor element, such as an IGBT. The gate control circuit 1 includes a first pulse generator 3, a first gate controlling portion 4, a second pulse generator 5, and a second gate controlling portion 6.

The first gate controlling portion 4 controls the gate voltage of the transistor Q1 based on a first control signal PGE when an input signal IN is at a second logical level (for example, low or L). The first gate controlling portion 4 includes a PMOS transistor (a second transistor) Q2, for example, and controls the gate voltage of the transistor Q2 in accordance with the input signal IN. More specifically, when the input signal IN is high or H, for example, the first gate controlling portion 4 turns on the transistor Q2 based on the first control signal PGE and brings the gate of the transistor Q1 to H. The first gate controlling portion 4 is also called a high-side driver.

The second gate controlling portion 6 controls the gate voltage of the transistor Q1 based on a second control signal NGE when the input signal IN is at a first logical level (for example, H). The second gate controlling portion 6 includes an NMOS transistor (a third transistor) Q3, for example, and controls the gate voltage of the transistor Q3 in accordance with the input signal IN. More specifically, when the input signal IN is L, for example, the second gate controlling portion 6 turns on the transistor Q3 based on the second control signal NGE and brings the gate of the transistor Q1 to L. The second gate controlling portion 6 is also called a low-side driver.

The gate of the transistor Q1 is connected to the drain of the transistor Q2 via a resistor R1. Likewise, the gate of the transistor Q1 is connected to the drain of the transistor Q3 via a resistor R2.

As will be described later, the gate control circuit 1 according to the present embodiment takes measures to prevent a breakdown of the transistor Q2 or Q3 by keeping an overcurrent from flowing through the transistor Q2 or Q3 even when a defect such as a short-circuit between the drain of the transistor Q2 and a high-side power supply voltage VCCH node or a short-circuit between the drain of the transistor Q3 and a low-side ground voltage VEE node.

The first pulse generator 3 outputs a first pulse signal P1 having a pulse width of a first time interval when the input signal IN changes from the second logical level (for example, L) to the first logical level (for example, H). The first pulse signal P1 has a high level only for the first time interval, for example. The second pulse generator 5 outputs a second pulse signal P2 having a pulse width of a second time interval when the input signal IN changes from the second logical level to the first logical level. The second pulse signal P2 has a high level only for the second time interval, for example.

The first pulse generator 3 and the first gate controlling portion 4 set the voltage level of an output signal by using a high-side power supply voltage VCCH and a high-side ground voltage HS_GND. The second pulse generator 5 and the second gate controlling portion 6 set the voltage level of an output signal by using a low-side power supply voltage VCCL and a low-side ground voltage VEE. The high-side power supply voltage VCCH is higher than the low-side power supply voltage VCCL, and the high-side ground voltage HS_GND is higher than the low-side ground voltage VEE.

As described above, since power supply (ground) voltages supplied to the second pulse generator 5 and to the second gate controlling portion 6 are different from those supplied to the first pulse generator 3 and the first gate controlling portion 4, when the first pulse generator 3 and the first gate controlling portion 4 perform transmission and reception of signals with the second pulse generator 5 and the second gate controlling portion 6, signal level conversion is required.

For this reason, the power supply circuit 2 in FIG. 1 includes a first level converter 7, a first delay device 8, a second level converter 9, and a second delay device 10.

The first level converter 7 outputs a first signal S1 obtained by converting the signal level of the input signal IN. The first delay device 8 generates a second signal S2, which is used by the first pulse generator 3 to generate the first pulse signal P1, by delaying the rising edge or the falling edge of the first signal S1. The first pulse generator 3 generates the first pulse signal P1 having a pulse width of the first time interval which is the length of time that has elapsed since the second signal S2 changed from L to H. The second level converter 9 outputs a third signal S3 obtained by converting the signal level of the first control signal PGE. As will be described later, the first control signal PGE is a gate voltage signal of the transistor Q2 in the first gate controlling portion 4. The second delay device 10 outputs a fourth signal S4 by delaying the rising edge or the falling edge of the second control signal NGE. As will be described later, the second control signal NGE is a gate voltage signal of the transistor Q3 in the second gate controlling portion 6. The first level converter 7 outputs the first signal S1 based on the fourth signal S4.

In addition to those described above, the power supply circuit 2 in FIG. 1 includes a third delay device 11 and a fourth delay device 12. The third delay device 11 generates a fifth signal S5 by delaying the rising edge or the falling edge of the third signal S3 generated by the second level converter 9 and outputs the fifth signal S5. The fourth delay device 12 generates a sixth signal S6 based on the input signal IN and the fifth signal S5 and outputs the sixth signal S6. The second gate controlling portion 6 generates the second gate control signal NGE based on the second pulse signal P2 generated by the second pulse generator and the sixth signal S6.

The first delay device 8, the second delay device 10, the third delay device 11, and the fourth delay device 12 are prevent the time at which the first gate controlling portion 4 turns on the transistor Q1 to be different from the time at which the second gate controlling portion 6 turns off the transistor Q1. Moreover, providing the first delay device 8 can prevent a flow-through current from flowing into a high-side ground voltage HS_GND node from the high-side power supply voltage VCCH node in the first gate controlling portion 4. Furthermore, providing the fourth delay device 12 can prevent a flow-through current from flowing into a low-side ground node from a low-side power supply voltage VCCL node in the second gate controlling portion 6.

Figure 2:
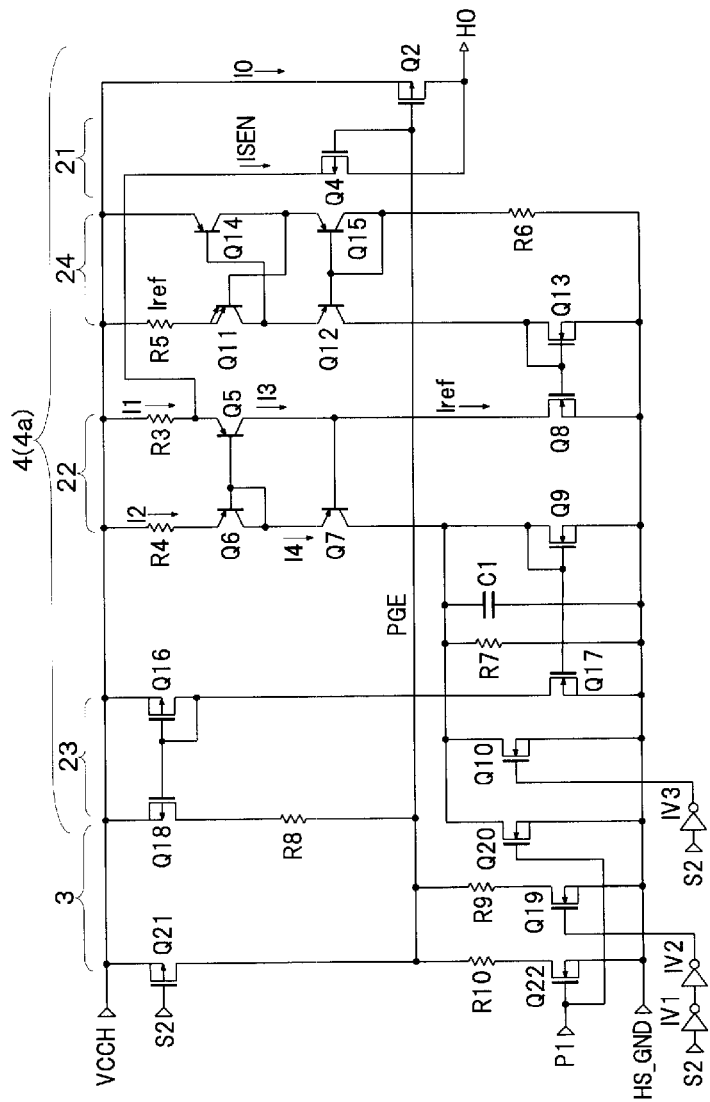
FIG. 2 is a circuit diagram depicting an example of the internal configuration of a first pulse generator and a first gate controlling portion in the gate control circuit.

FIG. 2 is a circuit diagram depicting an example of the internal configuration of the first pulse generator 3 and the first gate controlling portion 4 in the gate control circuit 1.

The first gate controlling portion 4 in FIG. 2 includes a first overcurrent controlling portion 4a. The first overcurrent controlling portion 4a controls the voltage level of the first control signal PGE such that a current between the source and the drain of the transistor Q2 does not exceed a first threshold value after the expiration of an output period of the first pulse signal P1. More specifically, the first overcurrent controlling portion 4a includes a first current detecting portion 21, a first current converting portion 22, a first gate setting portion 23, and a first current source 24. The first current detecting portion 21 detects a current corresponding to the source-drain current of the transistor Q2 and outputs the current. The first current converting portion 22 outputs a current corresponding to the current which is output from the first current detecting portion 21. An initial current which flows through the first current converting portion 22 is generated in the first current source 24. The first gate setting portion 23 sets the gate voltage of the transistor Q2 based on the current which is output from the first current converting portion 22.

The first current detecting portion 21 is configured to detect an overcurrent that flows between the source and the drain of the transistor Q2. The first current detecting portion 21 does not perform overcurrent detection while the first pulse generator 3 outputs the first pulse signal P1, and starts overcurrent detection after the output of the first pulse signal P1 is ended. More specifically, the first current detecting portion 21 starts overcurrent detection after the input signal IN changes from L to H and the output of the first pulse signal P1 is ended.

The first current detecting portion 21 includes a transistor (a fourth transistor) Q4 which forms a current mirror circuit with the transistor Q2. The transistor Q4 (for example, a PMOS transistor) has the same conductivity type as the transistor Q2. By adjusting the gate width W and the gate length L of the transistor Q2 and the transistor Q4 and the number m of transistors connected in parallel, a current which is much smaller than the source-drain current of the transistor Q2 can be passed between the source and the drain of the transistor Q4.

The first current converting portion 22 includes PNP transistors Q5 to Q7, resistors R3 and R4, and NMOS transistors Q8 to Q10. The source of the transistor Q4 is connected to the emitter of the transistor Q5. The drain of the transistor Q8 and the base of the transistor Q7 are connected to the collector of the transistor Q5. In accordance with a current which flows between the collector and the emitter of the transistor Q5 and between the drain and the source of the transistor Q8, a current which flows between the source and the drain of the transistor Q4 changes.

The transistor Q5 forms a current mirror circuit with the transistor Q6, and the ratio (the mirror ratio) between a current which flows between the emitter and the collector of the transistor Q5 and a current which flows between the emitter and the collector of the transistor Q6 is 1:1, for example. The transistor Q10 is on for a period during which the input signal IN is L and until a predetermined period has elapsed since the input signal IN changed from L to H; otherwise, the transistor Q10 is off.

The first current source 24 includes a resistor R5 and transistors Q11 to Q13 which are connected between the high-side power supply voltage VCCH node and the high-side ground voltage HS_GND node to form a cascade connection and transistors Q14 and Q15 and a resistor R6 which are connected between the high-side power supply voltage VCCH node and the high-side ground voltage HS_GND node to form a cascade connection.

The transistors Q11 and Q14 are connected to form a cross connection. The transistor Q15 is connected to the transistor Q14 to form a cascade connection. The transistor Q12 is connected to the transistor Q11 to form a cascade connection. The transistor Q13 forms a current mirror circuit with the transistor Q8 in the first current converting portion 22. As a result, an initial current which flows between the drain and the source of the transistor Q8 depends on the drain-source current of the transistor Q13 in the first current source 24. As described above, the first current source 24 generates an initial current (Iref) which flows through the first current converting portion 22. Iref=(VT/R5)×ln(N), where N is the area ratio between Q11 and Q14 and N>1, and Q12 and Q15 are assumed to have the same size. Incidentally, ln is a natural logarithm.

The first gate setting portion 23 includes transistors Q16 and Q17, which are connected between the high-side power supply voltage VCCH node and the high-side ground voltage HS_GND node to form a cascade connection, a PMOS transistor Q18, which forms a current mirror circuit with the transistor Q16, and resistors R8 and R9 and a transistor Q19, which are connected between the drain of the transistor Q18 and the high-side ground voltage HS_GND node to form a cascade connection.

The first pulse generator 3 includes a transistor Q20, which is connected between the source of the transistor Q9 and the high-side ground voltage HS_GND node, and a PMOS transistor Q21, a resistor R10, and an NMOS transistor Q22, which are connected between the high-side power supply voltage VCCH node and the high-side ground voltage HS_GND node to form a cascade connection.

The transistor Q19 is turned on when a predetermined period has elapsed since the input signal IN changed from L to H. The transistors Q20 and Q22 are on while the first pulse signal P1 is being output. The transistor Q21 is on in a period during which the input signal IN is L and until a predetermined period has elapsed since the input signal IN changed from L to H; otherwise, the transistor Q21 is off.

Figure 3:
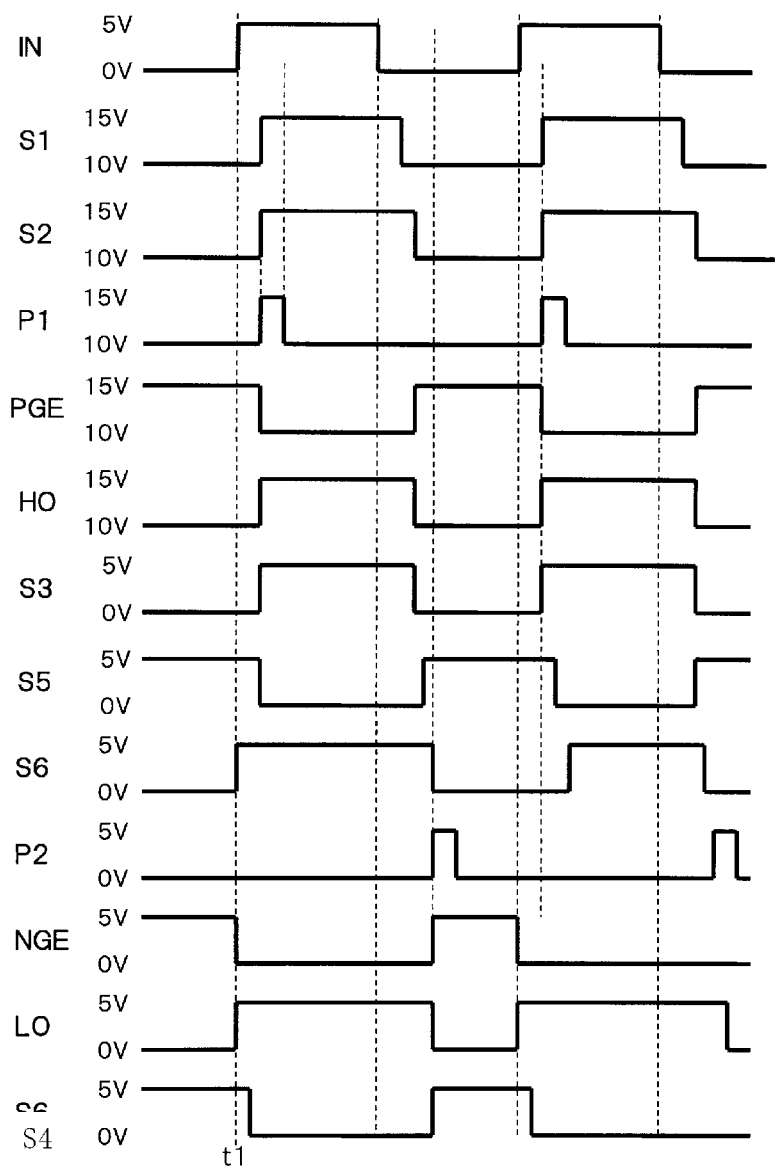
FIG. 3 is an operation timing diagram of the power supply circuit in FIG. 1.

FIG. 3 is an operation timing diagram of the power supply circuit 2 in FIG. 1. Hereinafter, with reference to FIG. 3, the operation of the power supply circuit 2 in FIG. 1 will be described.

First, when an input signal IN changes from L to H at time t1, the first level converter 7 generates a first signal S1 obtained by raising the signal level of the input signal IN by using the high-side power supply voltage VCCH and the high-side ground voltage HS_GND. The first level converter 7 generates the first signal S1 at a predetermined time after the input signal IN changed from L to H. The first delay device 8 generates a second signal S2 obtained by delaying the falling edge timing of the first signal S1 by a predetermined time. The first pulse generator 3 generates a first pulse signal P1 having a pulse width of the first time interval which is the length of time that has elapsed since the second signal S2 changed from L to H. While the first pulse signal P1 is being output, the first current detecting portion 21 in the first gate controlling portion 4 does not perform overcurrent detection between the source and the drain of the transistor Q2. The reason why overcurrent detection is not performed in this period is that a period during which the first pulse signal P1 is being output is a period immediately after the input signal IN changed from L to H and a large current has to flow between the source and the drain of the transistor Q2 in order to change the gate potential of the transistor Q1 quickly and to a sufficient level. Overcurrent detection by the first current detecting portion 21 is started when pulse output of the first pulse signal P1 is ended.

A first control signal PGE in FIG. 3 is a gate voltage signal of the transistor Q2. The falling edge timing of the first control signal PGE depends on the rising edge timing of the first pulse signal P1, and the rising edge timing of the first control signal PGE depends on the falling edge timing of the second signal S2.

The second level converter 9 outputs a third signal S3 obtained by converting the signal level of the first control signal PGE. The third delay device 11 outputs a fifth signal S5 obtained by delaying the falling edge of the third signal S3. The second pulse generator 8 outputs a second pulse signal P2 having a pulse width of the second time interval when the input signal IN changes from H to L and then the fifth signal S5 rises. Based on the input signal IN and the fifth signal S5, the fourth delay device 12 outputs a sixth signal S6 which becomes H at a time at which the input signal IN changes from L to H and becomes L at a timing at which the fifth signal S5 changes from L to H. The second gate controlling portion 6 outputs a second control signal NGE which becomes L at a timing at which the input signal IN changes L to H and becomes H at a timing at which the sixth signal S6 changes H to L. The second delay device 10 outputs a fourth signal S4 obtained by delaying the falling edge timing of the second control signal NGE.

As depicted in FIG. 3, settings are made such that a period during which the second control signal NGE is high does not coincide with a period during which the first control signal PGE is low, which prevents the flow of a current flowing through the transistors Q2 and Q3.

Next, the operation of the first gate controlling portion 4 in FIG. 2 will be described. The second signal S2 which is input to the gate of the transistor Q21 is an output signal of the first delay device 8 and is a signal obtained by delaying the input signal IN. While the second signal S2 is L, the transistor Q21 is on and the transistor Q2 is off.

The first pulse signal P1 which is input to the gate of the transistor Q22 is H only for the first time length after the second signal S2 changes from L to H. While the first pulse signal P1 is H, the transistor Q22 is on.

Therefore, after the input signal IN changes from L to H, the transistor Q21 is on and the transistor Q22 is off until the first pulse signal P1 is output. Then, in a period during which the first pulse signal P1 is being output, the transistor Q21 is off and the transistor Q22 is on.

In a period after the input signal IN changes from L to H and before the first pulse signal P1 is output, the gate voltage of the transistor Q2 becomes high and the transistor Q2 is turned off. As described above, by turning off the transistor Q2 in a predetermined period after the input signal IN changes from L to H, the transistors Q2 and Q3 can be prevented from being turned on at the same time.

Moreover, in a period during which the first pulse signal P1 is being output after the input signal IN changed from L to H, the transistor Q22 is turned on, whereby the gate voltage of the transistor Q2 becomes low and the transistor Q2 is turned on. As a result, in a period during which the first pulse signal P1 is being output, a sufficient amount of current can be passed between the source and the drain of the transistor Q2 and the gate voltage of the transistor Q1 can be raised quickly.

After the input signal IN changes from L to H and the output of the first pulse signal P1 is ended, both the transistors Q21 and Q22 are turned off, and the first current detecting portion 21 starts overcurrent detection between the source and the drain of the transistor Q2.

As described above, while the first pulse signal P1 is being output after the input signal IN changed from L to H, the first current detecting portion 21 does not perform overcurrent detection. After the output of the first pulse signal P1 is ended, the first current detecting portion 21 starts overcurrent detection.

The first current detecting portion 21 detects an overcurrent in the transistor Q4 by passing a current which is proportional to the source-drain current of the transistor Q2 between the source and the drain of the transistor Q4. The transistors Q2 and Q4 form a current mirror circuit and the mirror ratio is set at a few thousandths, for example. As a result, the first current detecting portion 21 detects a change in the source-drain current of the transistor Q2 in the transistor Q4 by converting that change into a slight change in a current.

The source-drain current of the transistor Q4 is supplied from the first current converting portion 22. That is, when the source-drain current of the transistor Q4 changes, a voltage between both ends of the resistor R3 in the first current converting portion 22 changes. The collector current of the transistor Q5 is the same current as the reference current Iref generated in the first current source 24. When a drain current ISEN of the transistor Q4 increases, a current which is different from a mirror current flows through the transistor Q8 forming the current mirror circuit with the transistor Q13. That is, when the drain current ISEN of the transistor Q4 is sufficiently larger than the reference current Iref, the collector current of the transistor Q6 can be approximated to ISEN.

In FIG. 1, the source current of the transistor Q2 is assumed to be I0, the drain current of the transistor Q4 is assumed to be ISEN, the reference current flowing through the resistor R5 in the first current source 24 is assumed to be Iref, the currents flowing through the resistors R3 and R4 in the first current converting portion 22 are assumed to be I1 and I2, respectively, the collector current of the transistor Q5 is assumed to be I3, the collector current of the transistor Q6 is assumed to be I4, the base-emitter voltage of the transistor Q5 is assumed to be VBEQ5, the base-emitter voltage of the transistor Q6 is assumed to be VBEQ6, the saturation current of each transistor is assumed to be Is, and the mirror ratio between the transistors Q2 and Q4 is assumed to be M.

$$ISEN=I0/M \tag{2}$$

$$I1=I3+ISEN \tag{3}$$

$$I3=Iref \tag{4}$$

$$I1 \times R3 + VBEQ5 = I2 \times R4 + VBEQ6 \tag{5}$$

$$VBEQ5 = VT \times \ln(I2/Is) \tag{6}$$

$$VBEQ6 = VT \times \ln(Iref/Is) \tag{7}$$

Equation (5) is expressed as Equation (8) below by using Equation (6) and Equation (7).

$$I2 \times R4 + VT \times \ln(I2/Is) = R3 \times (Iref+ISEN) + VT \times \ln(Iref/Is) \tag{8}$$

If ISEN>>Iref, the term VT of Equation (8) can be ignored. Thus, if R3=R4, Equation (8) can be approximated with Equation (9).

$$I2=I4=ISEN \tag{9}$$

As is clear from Equation (9), when an overcurrent flows between the source and the drain of the transistor Q2, a current which is nearly equal to the current ISEN detected in the transistor Q4 flows through the resistor R4 in the first current converting portion 22.

A signal which is input to the gate of the transistor Q10 is obtained by inverting the second signal S2 output from the first delay device 8 and is a signal which becomes L a predetermined time after the input signal IN changes from L to H. Thus, the transistor Q10 is on for a period of time during which the input signal IN is L and until a predetermined period has elapsed since the input signal IN changed from L to H; otherwise, the transistor Q10 is off. When the transistor Q10 is turned on, since the collector of the transistor Q7 becomes the high-side ground voltage HS_GND, the flow of the current through the transistor Q9 is stopped and the first gate setting portion 23 does not perform the operation to control the gate voltage of the transistor Q2.

When a predetermined period has elapsed since the input signal IN changed from L to H, the transistor Q10 is turned off, and a current corresponding to the source-drain current of the transistor Q6 flows between the drain and the source of the transistor Q9. Since the transistor Q17 forms a current mirror circuit with the transistor Q9, a current which is proportional to the drain-source current of the transistor Q9 flows between the drain and the source of the transistor Q17.

Since the transistor Q16 is connected to the transistor Q17 to form a cascade connection, a current which is nearly equal to the drain-source current of the transistor Q17 flows between the source and the drain of the transistor Q16. Since the transistor Q18 forms a current mirror circuit with the transistor Q17, a current which is proportional to the source-drain current of the transistor Q17 flows between the source and the drain of the transistor Q18.

As described earlier, when a predetermined period has elapsed since the input signal IN changed from L to H, the transistor Q19 is turned on. If an overcurrent flows between the source and the drain of the transistor Q2 while the transistor Q19 is on, the first gate setting portion 23 sets the gate voltage of the transistor Q2 at a fixed voltage Vset corresponding to the resistance ratio between the resistors R8 and R9. As a result, even when an overcurrent flows between the source and the drain of the transistor Q2, since the gate voltage of the transistor Q2 is set at a predetermined fixed voltage Vset, a current which flows between the source and the drain can be restricted.

Figure 4:
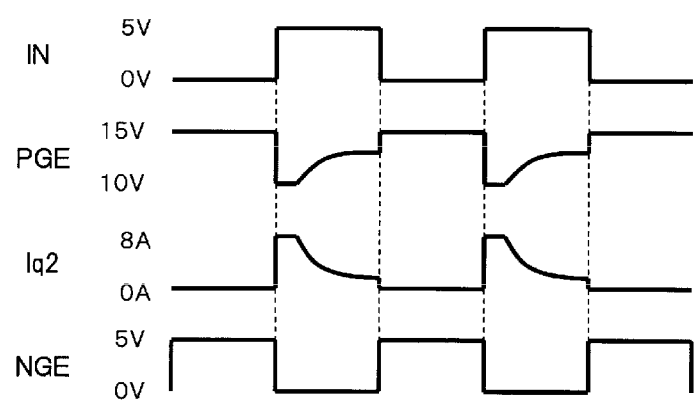
FIG. 4 is a simulation waveform diagram when the drain of a transistor in FIG. 1 is caused to short with a high-side ground voltage node.

FIG. 4 is a simulation waveform diagram when the drain of the transistor Q2 in FIG. 1 is short-circuited at a high-side ground voltage HS_GND level. Since overcurrent detection is not performed in a predetermined period after the input signal IN changed from L to H, a current flowing into the drain of the transistor Q2 from the source thereof is large. After a lapse of the predetermined period, the first current detecting portion 21 operates to suppress a current Iq2 between the source and the drain of the transistor Q2, and the gate voltage of the transistor Q2 gradually increases and eventually becomes the fixed voltage Vset. As a result, the current Iq2 flowing into the drain of the transistor Q2 from the source thereof also decreases.

When the input signal IN changes from H to L, the second gate controlling portion 6 in FIG. 1 controls the gate voltage of the transistor Q3.

Figure 5:
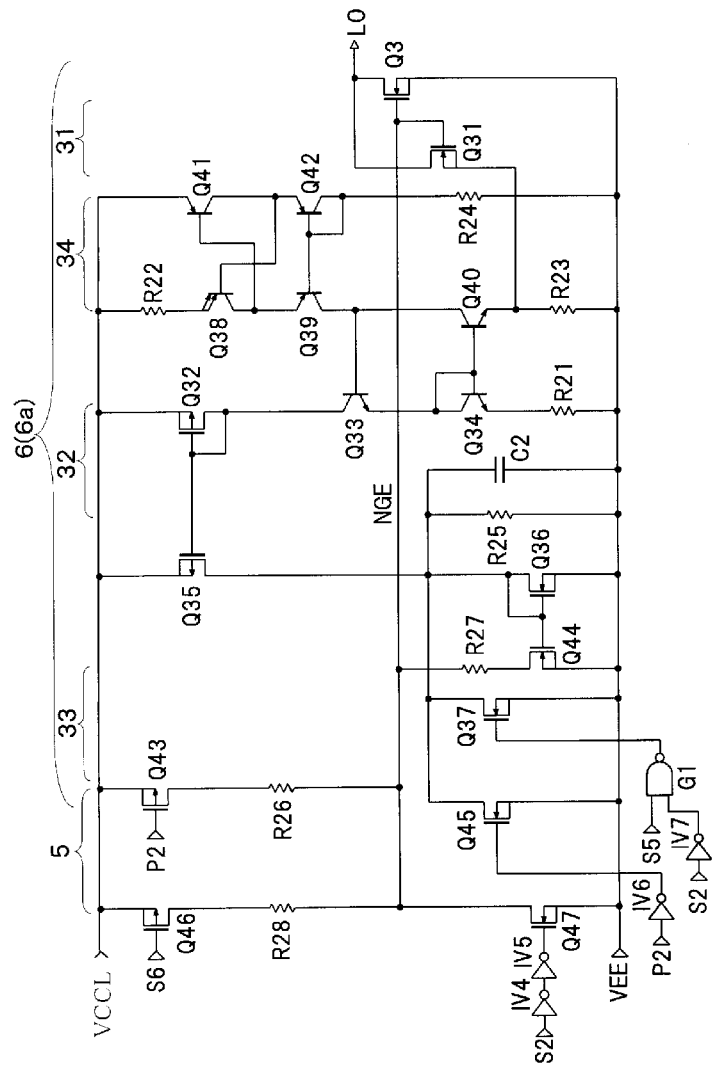
FIG. 5 is a circuit diagram depicting an example of the internal configuration of a second pulse generator and a second gate controlling portion in the gate control circuit.

FIG. 5 is a circuit diagram depicting an example of the internal configuration of the second pulse generator 5 and the second gate controlling portion 6 in the gate control circuit 1.

The second gate controlling portion 6 in FIG. 5 includes a second overcurrent controlling portion 6a. After the expiration of an output period of the second pulse signal P2, the second overcurrent controlling portion 6a controls the voltage level of the second control signal NGE such that a current between the source and the drain of the transistor Q3 does not exceed a second threshold value. More specifically, the second overcurrent controlling portion 6a includes a second current detecting portion 31, a second current converting portion 32, a second gate setting portion 33, and a second current source 34. The second current detecting portion 31 detects a current corresponding to the drain-source current of the transistor Q3 and outputs the current. The second current converting portion 32 outputs a current corresponding to the current which is output from the second current detecting portion 31. An initial current which flows through the second current converting portion 32 is generated in the second current source 34. The second gate setting portion 33 sets the gate voltage of the transistor Q3 based on the current which is output from the second current converting portion 32.

The second current detecting portion 31 includes a transistor (a fifth transistor) Q31 forming a current mirror circuit with the transistor Q3. The transistor Q31 (for example, an NMOS transistor) has the same conductivity type as the transistor Q3.

The second current converting portion 32 includes a PMOS transistor Q32, NPN transistors Q33 and Q34, and a resistor R21. The above are connected between the low-side power supply voltage VCCL node and the low-side ground voltage VEE node to form a cascade connection. The second current converting portion 32 further includes PMOS transistors Q35 and Q36, which are also connected between the low-side power supply voltage VCCL node and the low-side ground voltage VEE node to form a cascade connection, and an NMOS transistor Q37.

The second current source 34 includes a resistor R22 and transistors Q38 to Q40 which are connected between the low-side power supply voltage VCCL node and the low-side ground voltage VEE node to form a cascade connection and transistors Q41 and Q42 and a resistor R24 which are also connected between the low-side power supply voltage VCCL node and the low-side ground voltage VEE node to form a cascade connection.

The second gate setting portion 33 includes a PMOS transistor Q43, resistors R26 and R27, and an NMOS transistor Q44 which are connected between the low-side power supply voltage VCCL node and the low-side ground voltage VEE node to form a cascade connection.

The second pulse generator 5 includes a PMOS transistor Q46, a resistor R28, and a PMOS transistor Q47, which are connected between the low-side power supply voltage VCCL node and the low-side ground voltage VEE node to form a cascade connection. The second pulse generator 5 also includes an NMOS transistor Q45.

Since the circuit configuration and the circuit operation of the second gate controlling portion 6 in FIG. 5 are nearly identical to the circuit configuration and the circuit operation of the first gate controlling portion 4 in FIG. 2, the detailed explanations thereof will be omitted in the following description.

Figure 6:
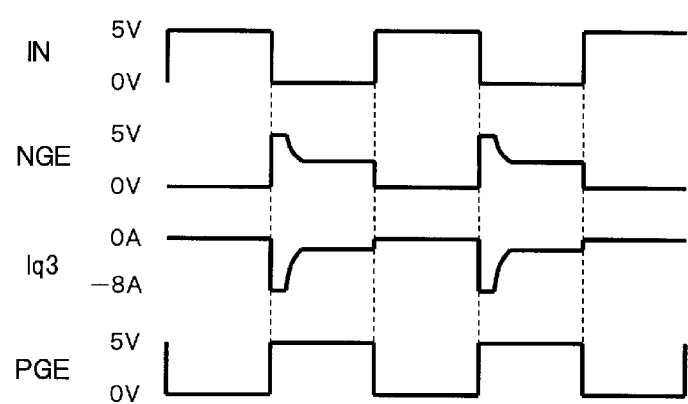
FIG. 6 is a simulation waveform diagram when the drain of a transistor in FIG. 5 is short-circuited with a low-side power supply voltage node.

FIG. 6 is a waveform diagram illustrating when the drain of the transistor Q3 in FIG. 5 is short-circuited with the low-side power supply voltage VCCL node. Since overcurrent detection is not performed while the second pulse signal P2 is being output after the input signal IN is changed from H to L, a current Iq3 flowing into the drain of the transistor Q3 from the low-side power supply voltage VCCL node is large. After the output of the second pulse signal P2 is ended, the second current detecting portion 31 performs the operation to suppress the current Iq3 between the drain and the source of the transistor Q3 and the gate voltage of the transistor Q3 gradually decreases and eventually becomes a fixed voltage. As a result, the current Iq3 flowing into the drain of the transistor Q3 from the low-side power supply voltage VCCL node also decreases.

As depicted in FIG. 1, in an input stage of the second level converter 9 and in an input stage of the second delay device 10, Schmitt trigger inverters 9a and 10a are respectively provided. An operational feature of the Schmitt trigger inverters 9a and 10a is that a threshold level based on the input signal IN when the input signal IN is determined to be H is different from a threshold level based on the input signal IN when the input signal IN is determined to be L. When an overcurrent flows between the source and the drain of the transistor Q2, the first gate controlling portion 4 whose detailed configuration is depicted in FIG. 2 prevents the overcurrent from continuously flowing by adjusting the gate voltage of the transistor Q2. The first control signal PGE which is the gate voltage signal of the first gate controlling portion 4 is input to the second level converter 9. If the first gate controlling portion 4 adjusts the signal level of the first control signal PGE to prevent an overcurrent, the second level converter 9 may incorrectly determine the logical level of the input signal IN and perform signal level conversion if no measures are taken. Thus, the Schmitt trigger inverter 9a is provided in the input stage of the second level converter 9 to prevent the second level converter 9 from incorrectly determining the logical level of the input signal IN and performing signal level conversion.

The same goes for the second delay device 10. The second delay device 10 delays the second control signal NGE connected to the gate of the transistor Q3 in the second gate controlling portion 6. When an overcurrent flows between the drain and the source of the transistor Q3, the second gate controlling portion 6 suppresses the overcurrent by adjusting the signal level of the second control signal NGE. To prevent the second delay device 10 from incorrectly determining the logical level of the second control signal NGE as a result of the signal level of the second control signal NGE being adjusted, the Schmitt trigger inverter 10a is included in the input stage of the second delay device 10.

As described above, in the first embodiment, when an overcurrent flows between the source and the drain (or the drain and the source) of the transistor Q2 or Q3 that controls the gate voltage of the transistor Q1, the overcurrent is suppressed by automatic adjustment of the gate voltage of the transistor Q2 or Q3. As a result, even when the source, the drain, or the like, of the transistor Q2 or Q3 is short-circuited with the power supply voltage, the ground voltage, or the like, the transistor Q2 or Q3 is prevented from being broken down, which improves safety and maintainability.

Such an overcurrent suppression function is provided in the first gate controlling portion 4 that controls the gate voltage of the transistor Q2 and the second gate controlling portion 6 that controls the gate voltage of the transistor Q3. For example, the first gate controlling portion 4 monitors the source-drain current of the transistor Q2 and, when an overcurrent flows between the source and the drain of the transistor Q2, sets the gate voltage of the transistor Q2 at a fixed voltage. However, the overcurrent suppression function is configured not to function for a predetermined time after the input signal IN has changed from L to H. By doing so, the gate voltage of the transistor Q1 can be set at a desired voltage level quickly by passing a sufficient current between the source and the drain of the transistor Q2 immediately after a change in the logic of the input signal IN. The same goes for the second gate controlling portion 6.

As described above, the first gate controlling portion 4 and the second gate controlling portion 6 can prevent an overcurrent from flowing between the source and the drain (or the drain and the source) of the transistor Q2 and between the source and the drain (or the drain and the source) of the transistor Q3, respectively, without reducing the responsiveness of the transistor Q1.

Moreover, in the present embodiment, the transistors Q2 and Q3 are prevented from being turned on at the same time by providing the first delay device 8, the second delay device 10, the third delay device 11, and the fourth delay device 12, thereby preventing the generation of a current flowing through the transistors Q2 and Q3. Moreover, these delay devices prevent the generation of a flow-through current flowing from the high-side power supply voltage VCCH node to the high-side ground voltage HS_GND node in the first gate controlling portion 4 and a flow-through current flowing from the low-side power supply voltage VCCL node to the low-side ground voltage VEE node in the second gate controlling portion 6.

Second Embodiment

In the first gate controlling portion 4 in FIG. 1, a plurality of current mirror circuits are provided and currents having a proportional relationship are generated in the current mirror circuits, whereby the gate voltage of the transistor Q2 is controlled. In a second embodiment, an amplifier is provided in place of some of the current mirror circuits.

Figure 7:
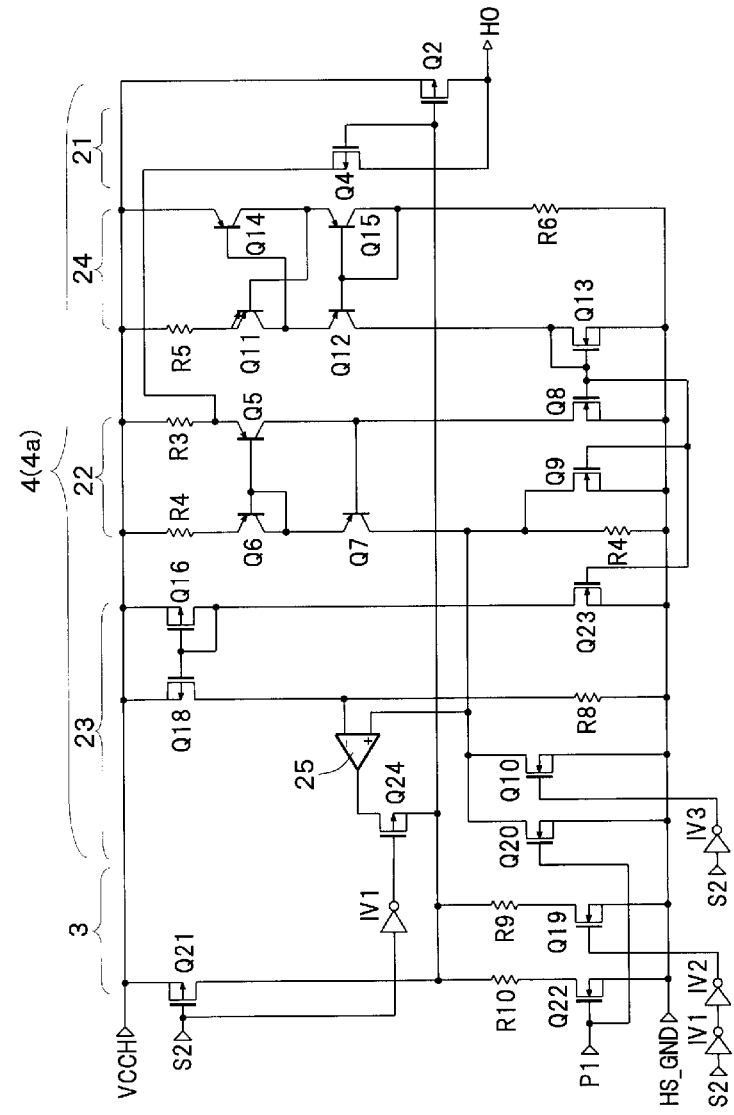
FIG. 7 is a circuit diagram depicting the internal configuration of a first gate controlling portion according to a second embodiment.

FIG. 7 is a circuit diagram depicting the internal configuration of a first gate controlling portion 4 according to the second embodiment. The first gate controlling portion 4 in FIG. 7 includes a first current detecting portion 21, a first current converting portion 22, a first gate setting portion 23, and a first current source 24. Among these component elements, the first current detecting portion 21, the first current converting portion 22, and the first current source 24 are configured in a manner similar to FIG. 2. Therefore, the detailed explanations thereof will be omitted.

The first gate setting portion 23 in FIG. 7 includes a PMOS transistor Q16 and an NMOS transistor Q23 which are connected between the high-side power supply voltage VCCH node and the high-side ground voltage HS_GND node to form a cascade connection, a PMOS transistor Q18 which forms a current mirror circuit with the transistor Q16, a resistor R8 interposed between the drain of the transistor Q18 and the high-side ground voltage HS_GND node, an amplifier (a first comparator) 25, and a PMOS transistor (a sixth transistor) Q24.

The amplifier 25 detects whether or not the collector voltage of the transistor Q7 is higher than a reference voltage by using the voltage at a connection node between the drain of the transistor Q18 and the resistor R8 as the reference voltage. When an overcurrent flows between the source and the drain of the transistor Q2, the emitter current of the transistor Q7 increases and the collector voltage of the transistor Q7 increases. As a result, the output voltage of the amplifier 25 increases. The output terminal of the amplifier 25 is connected to the drain of the transistor Q24. A signal obtained by inverting the second signal S2 by an inverter is input to the gate of the transistor Q24. The second signal S2 becomes H when a predetermined period has elapsed since the input signal IN has changed from L to H. Thus, the gate of the transistor Q24 is low after a lapse of the predetermined period. Therefore, when the output level of the amplifier 25 increases, the transistor Q24 is turned on and the gate voltage of the transistor Q2 increases, whereby an overcurrent is suppressed.

Since the circuit in FIG. 7 determines whether or not to increase the gate voltage of the transistor Q2 based on a voltage comparison in the amplifier 25, unlike the circuit in FIG. 2, there is no need to provide a plurality of current mirror circuits and set the mirror ratio properly, which facilitates design.

Figure 8:
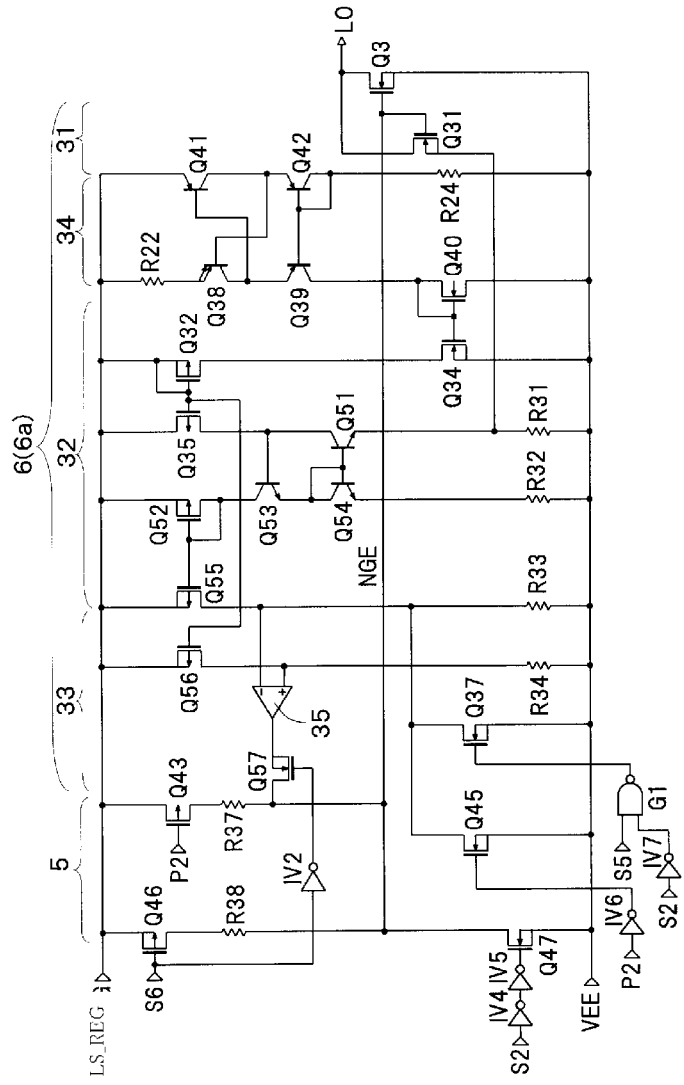
FIG. 8 is a circuit diagram depicting the internal configuration of a second gate controlling portion according to the second embodiment.

FIG. 8 is a circuit diagram depicting the internal configuration of a second gate controlling portion 6 according to the second embodiment. The second gate controlling portion 6 in FIG. 8 includes a second current detecting portion 31, a second current converting portion 32, a second gate setting portion 33, and a second current source 34.

The second gate setting portion 33 in FIG. 8 includes a PMOS transistor Q52, NPN transistors Q53 and Q54, and a resistor R32, which are connected between a low-side power supply voltage LS_REG node and the low-side ground voltage VEE node to form a cascade connection. The second gate setting portion 33 also includes a PMOS transistor Q55 which forms a current mirror circuit with the transistor Q52, an NMOS transistor Q34, and a resistor R33, which are connected in parallel between the drain of the transistor Q55 and the low-side ground voltage VEE node. The second gate setting portion 33 further includes a PMOS transistor Q56 and a resistor R34, which are connected between the low-side power supply voltage LS_REG node and the low-side ground voltage VEE node to form a cascade connection, an amplifier (a second comparator) 35, an NMOS transistor (a seventh transistor) Q57, and an inverter IV2. Since the circuit operation in FIG. 8 is similar to the circuit operation in FIG. 7, the detailed explanation thereof is omitted.

As described above, in the second embodiment, since detection of an overcurrent and control of the gate voltages of the transistors Q2 and Q3 are performed by providing the amplifiers 25 and 35 in place of the current mirror circuits, the internal configurations of the first gate controlling portion 4 and the second gate controlling portion 6 can be simplified compared to the internal configurations thereof in the first embodiment.

Third Embodiment

A third embodiment differs from the first and second embodiments in the internal configurations of the first current detecting portion 21 and the second current detecting portion 31.

Figure 9:
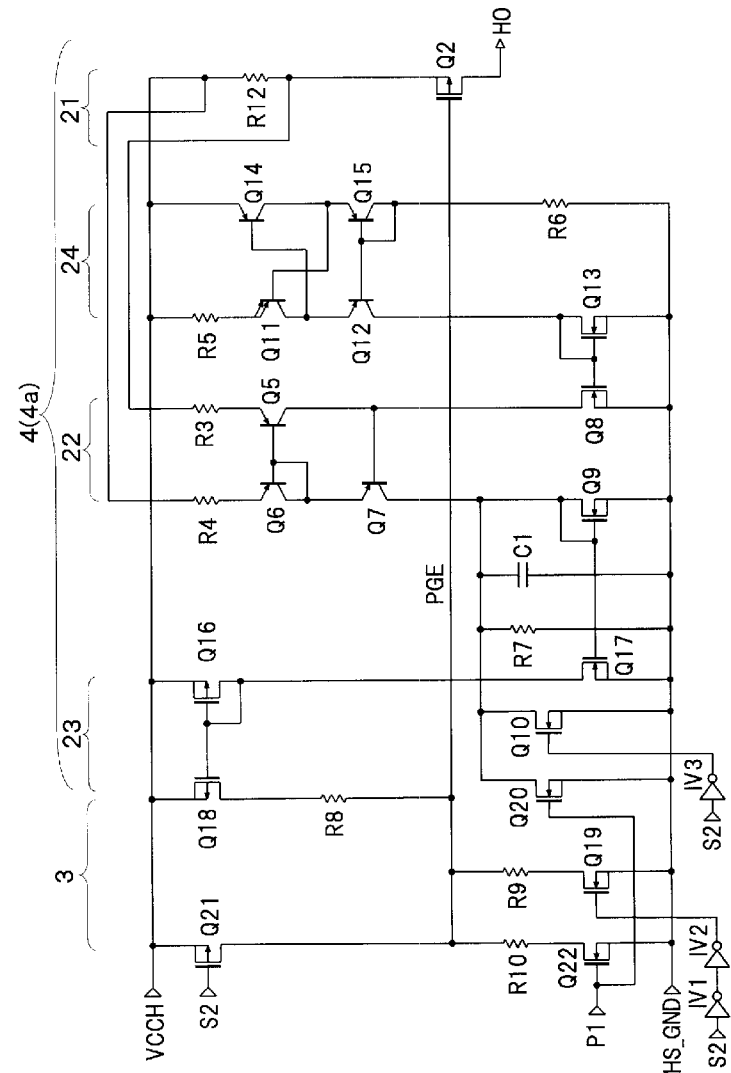
FIG. 9 is a circuit diagram depicting the internal configuration of a first gate controlling portion according to a third embodiment.

FIG. 9 is a circuit diagram depicting the internal configuration of a first gate controlling portion 4 according to the third embodiment. FIG. 9 includes a circuit configuration similar to the circuit configuration in FIG. 2 except for the first current detecting portion 21. The first current detecting portion 21 in FIG. 9 includes a metal resistor (a first metal resistor) R12, and the NMOS transistor Q4 in FIG. 1 is omitted. The metal resistor R12 is formed of a wiring pattern which is connected to the source of the transistor Q2, for example. By adjusting the width and the length of the wiring pattern, the metal resistor R12 can be accurately set at a desired resistance value. One end of the metal resistor R12 is connected to the source of the transistor Q2 and the resistor R3, and the other end is connected to the resistor R4.

If the resistance value of the metal resistor R12 is assumed to be rx, the current flowing through the metal resistor R12 is assumed to be I0, the current flowing through the transistor Q5 is assumed to be I1, the current flowing through the resistor R4 is assumed to be I2, the saturation current of the transistor is assumed to be Is, and the thermal electromotive force of the transistor is assumed to be VT, the following equation holds:

$$rx \times (I0+I1)+R3 \times I1+VT \times \ln(I1/Is) = R4 \times I2+VT \times \ln(I2/Is) \quad (1)$$

As is known from Equation (1), the current flowing through the resistors R3 and R4 changes in accordance with the current flowing through the metal resistor R12. By controlling the gate voltage of the transistor Q2 in the first gate setting portion 23 by detecting the current flowing through the resistor R4, an overcurrent can be suppressed.

Figure 10:
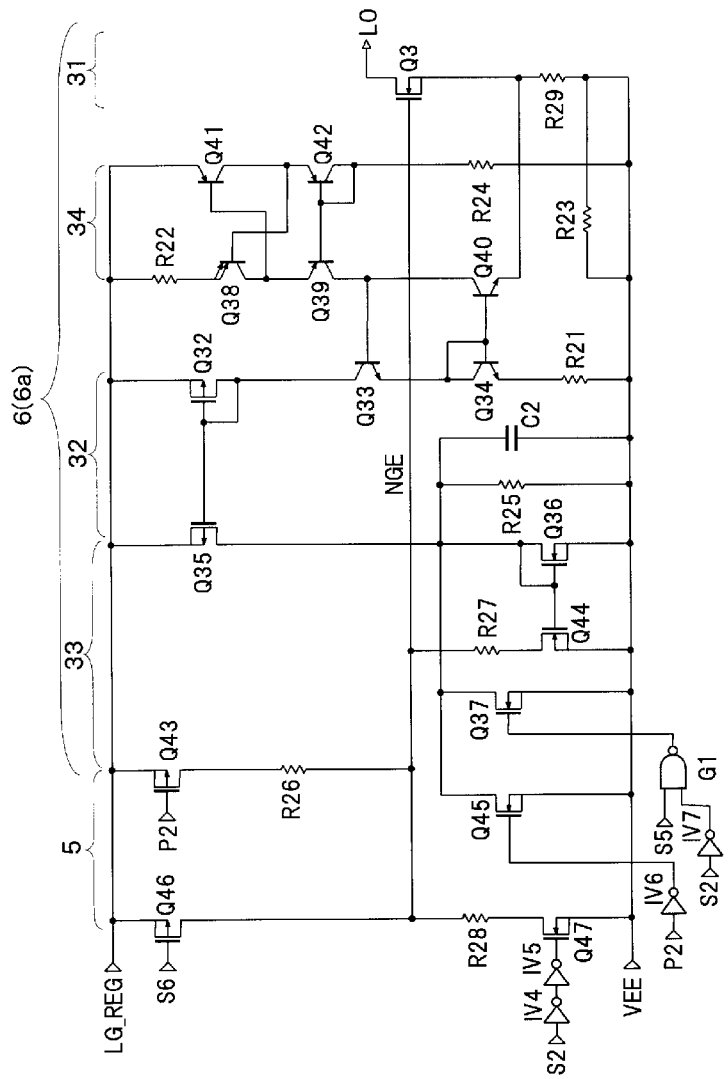
FIG. 10 is a circuit diagram depicting the internal configuration of a second gate controlling portion according to the third embodiment.

FIG. 10 is a circuit diagram depicting the internal configuration of a second gate controlling portion 6 according to the third embodiment. FIG. 10 depicts a circuit configuration similar to the circuit configuration in FIG. 5 except for the second current detecting portion 31. The second current detecting portion 31 in FIG. 10 includes a metal resistor (a second metal resistor) R29, and the NMOS transistor Q4 in FIG. 5 is omitted. Since the operation of the second gate controlling portion 6 in FIG. 10 is similar to the operation of the first gate controlling portion 4 in FIG. 9, the detailed explanation thereof is omitted.

As described above, in the third embodiment, since an overcurrent flowing between the source and the drain of the transistor Q2 and an overcurrent flowing between the source and the drain of the transistor Q3 are detected by using the metal resistors R12 and R29, respectively, in place of the transistors, the overcurrent can be detected accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gate control circuit comprising:
    a first pulse generator that outputs a first pulse signal having a pulse width of a first time interval when an input signal changes from a first logical level to a second logical level;
    a first gate controlling portion that controls a gate voltage of a first transistor based on a first control signal when the input signal is at the second logical level;
    a second pulse generator that outputs a second pulse signal having a pulse width of a second time interval when the input signal changes from the second logical level to the first logical level; and
    a second gate controlling portion that controls the gate voltage of the first transistor based on a second control signal when the input signal is the at first logical level,
    wherein
    the first gate controlling portion includes
        a second transistor that controls the gate voltage of the first transistor based on the first control signal when the input signal is at the second logical level, and
        a first overcurrent controlling portion that controls a voltage level of the first control signal such that a current between a source and a drain of the second transistor does not exceed a first threshold value after an expiration of an output period of the first pulse signal.

2. The circuit according to claim 1, wherein
the second gate controlling portion includes
    a third transistor that controls the gate voltage of the first transistor based on the second control signal when the input signal is at the second logical level, and
    a second overcurrent controlling portion that controls a voltage level of the second control signal such that a current between a source and a drain of the third transistor does not exceed a second threshold value after an expiration of an output period of the second pulse signal.

3. The circuit according to claim 2, wherein
the first gate controlling portion generates the first control signal so that the first transistor is not turned on at a same time as the second transistor, and
the second gate controlling portion generates the second control signal so that the third transistor is not turned on at a same time as the first transistor.

4. The circuit according to claim 2, further comprising:
a first level converter that outputs a first signal obtained by converting a signal level of the input signal;
a first delay device that generates, by delaying a rising edge or a falling edge of the first signal, a second signal which is used by the first pulse generator to generate the first pulse signal;
a second level converter that outputs a third signal obtained by converting a signal level of the first control signal; and a second delay device that outputs a fourth signal by
delaying a rising edge or a falling edge of the second
control signal,
wherein
the first level converter outputs the first signal based on
the fourth signal, and
the first pulse generator outputs the first pulse signal
having a pulse width of the first time interval when the
second signal changes from the first logical level to the
second logical level.

5. The circuit according to claim 4, further comprising:
a first Schmitt trigger inverter that is provided in an input
stage of the second level converter and inverts an
output by changing a threshold value in accordance
with a particular logical level of the first control signal;
and
a second Schmitt trigger inverter that is provided in an
input stage of the second delay device and inverts an
output by changing a threshold value in accordance
with a particular logical level of the second control
signal.

6. The circuit according to claim 2, wherein
the first overcurrent controlling portion includes
    a first current detecting portion that outputs a current
        corresponding to a source-drain current of the second
        transistor,
    a first current converting portion that outputs a current
        corresponding to the current which is output from the
        first current detecting portion, and
    a first gate setting portion that sets a gate voltage of the
        second transistor based on the current which is
        output from the first current converting portion, and
the second overcurrent controlling portion includes
    a second current detecting portion that outputs a current
        corresponding to a source-drain current of the third
        transistor,
    a second current converting portion that outputs a
        current corresponding to the current which is output
        from the second current detecting portion, and
    a second gate setting portion that sets a gate voltage of
        the third transistor based on the current which is
        output from the second current converting portion.

7. The circuit according to claim 6, wherein
the first gate setting portion sets the gate voltage of the
second transistor at a first voltage level when the
current between the source and the drain of the second
transistor reaches the first threshold value, and
the second gate setting portion sets the gate voltage of the
third transistor at a second voltage level when the
current between the source and the drain of the third
transistor reaches the second threshold value.

8. The circuit according to claim 7, wherein
the first current detecting portion includes a fourth transistor forming a current mirror circuit with the second
transistor,
the second current detecting portion includes a fifth
transistor forming a current mirror circuit with the third
transistor,
the first current converting portion outputs a current
corresponding to a current flowing between a source
and a drain of the fourth transistor, and
the second current converting portion outputs a current
corresponding to a current flowing between a source
and a drain of the fifth transistor.

9. The circuit according to claim 7, wherein
the first gate setting portion includes a first comparator that compares a voltage corresponding to the current which is output from the first
current converting portion with a first reference
voltage, and
a sixth transistor that controls whether or not to set the
gate voltage of the second transistor at the first
voltage level in accordance with an output level of
the first comparator, and
the second gate setting portion includes
a second comparator that compares a voltage corresponding to the current which is output from the
second current converting portion with a second
reference voltage, and
a seventh transistor that controls whether or not to set
the gate voltage of the third transistor at the second
voltage level in accordance with an output level of
the second comparator.

10. The circuit according to claim 7, wherein
the first current detecting portion includes a first metal
resistor connected to the source or the drain of the
second transistor,
the first current converting portion outputs a current
corresponding to a current flowing through the first
metal resistor,
the second current detecting portion includes a second
metal resistor connected to the drain or the source of the
third transistor, and
the second current converting portion outputs a current
corresponding to a current flowing through the second
metal resistor.

11. A power supply circuit comprising:
a first transistor; and
a gate control circuit that controls a gate voltage of the
first transistor,
wherein
the gate control circuit includes
    a first pulse generator that outputs a first pulse signal
        having a pulse width of a first time interval when an
        input signal changes from a first logical level to a
        second logical level,
    a first gate controlling portion that controls the gate
        voltage of the first transistor based on a first control
        signal when the input signal is at the second logical
        level,
    a second pulse generator that outputs a second pulse
        signal having a pulse width of a second time interval
        when the input signal changes from the second
        logical level to the first logical level, and
    a second gate controlling portion that controls the gate
        voltage of the first transistor based on a second
        control signal when the input signal is at the first
        logical level,
the first gate controlling portion includes
    a second transistor that controls the gate voltage of the
        first transistor based on the first control signal when
        the input signal is at the second logical level, and
    a first overcurrent controlling portion that controls a
        voltage level of the first control signal such that a
        current between a source and a drain of the second
        transistor does not exceed a first threshold value after
        an expiration of an output period of the first pulse
        signal.

12. The circuit according to claim 11, wherein
the second gate controlling portion includes a third transistor that controls the gate voltage of the first transistor based on the second control signal when the input signal is at the second logical level, and a second overcurrent controlling portion that controls a voltage level of the second control signal such that a current between a source and a drain of the third transistor does not exceed a second threshold value after an expiration of an output period of the second pulse signal.

13. The circuit according to claim 12, wherein
the first gate controlling portion generates the first control signal so that the first transistor is not turned on at a same time as the second transistor, and
the second gate controlling portion generates the second control signal so that the third transistor is not turned on at a same time as the first transistor.

14. The circuit according to claim 12, further comprising:
a first level converter that outputs a first signal obtained by converting a signal level of the input signal;
a first delay device that generates, by delaying a rising edge or a falling edge of the first signal, a second signal which is used by the first pulse generator to generate the first pulse signal;
a second level converter that outputs a third signal obtained by converting a signal level of the first control signal; and
a second delay device that outputs a fourth signal by delaying a rising edge or a falling edge of the second control signal,
wherein
the first level converter outputs the first signal based on the fourth signal, and
the first pulse generator outputs the first pulse signal having a pulse width of the first time interval when the second signal changes from the first logical level to the second logical level.

15. The circuit according to claim 14, further comprising:
a first Schmitt trigger inverter that is provided in an input stage of the second level converter and inverts an output by changing a threshold value in accordance with a particular logical level of the first control signal; and
a second Schmitt trigger inverter that is provided in an input stage of the second delay device and inverts an output by changing a threshold value in accordance with a particular logical level of the second control signal.

16. The circuit according to claim 12, wherein
the first overcurrent controlling portion includes
a first current detecting portion that outputs a current corresponding to a source-drain current of the second transistor,
a first current converting portion that outputs a current corresponding to the current which is output from the first current detecting portion, and
a first gate setting portion that sets a gate voltage of the second transistor based on the current which is output from the first current converting portion, and
the second overcurrent controlling portion includes
a second current detecting portion that outputs a current corresponding to a source-drain current of the third transistor, a second current converting portion that outputs a current corresponding to the current which is output from the second current detecting portion, and
a second gate setting portion that sets a gate voltage of the third transistor based on the current which is output from the second current converting portion.

17. The circuit according to claim 16, wherein
the first gate setting portion sets the gate voltage of the second transistor at a first voltage level when the current between the source and the drain of the second transistor reaches the first threshold value, and
the second gate setting portion sets the gate voltage of the third transistor at a second voltage level when the current between the source and the drain of the third transistor reaches the second threshold value.

18. The circuit according to claim 17, wherein
the first current detecting portion includes a fourth transistor forming a current mirror circuit with the second transistor,
the second current detecting portion includes a fifth transistor forming a current mirror circuit with the third transistor,
the first current converting portion outputs a current corresponding to a current flowing between a source and a drain of the fourth transistor, and
the second current converting portion outputs a current corresponding to a current flowing between a source and a drain of the fifth transistor.

19. The circuit according to claim 17, wherein
the first gate setting portion includes
a first comparator that compares a voltage corresponding to the current which is output from the first current converting portion with a first reference voltage, and
a sixth transistor that controls whether or not to set the gate voltage of the second transistor at the first voltage level in accordance with an output level of the first comparator, and
the second gate setting portion includes
a second comparator that compares a voltage corresponding to the current which is output from the second current converting portion with a second reference voltage, and
a seventh transistor that controls whether or not to set the gate voltage of the third transistor at the second voltage level in accordance with an output level of the second comparator.

20. The circuit according to claim 17, wherein
the first current detecting portion includes a first metal resistor connected to the source or the drain of the second transistor,
the first current converting portion outputs a current corresponding to a current flowing through the first metal resistor,
the second current detecting portion includes a second metal resistor connected to the drain or the source of the third transistor, and
the second current converting portion outputs a current corresponding to a current flowing through the second metal resistor.

* * * * *